US006708302B1

(12) United States Patent
Shibayama et al.

(10) Patent No.: US 6,708,302 B1
(45) Date of Patent: Mar. 16, 2004

(54) SEMICONDUCTOR MODULE

(75) Inventors: Mari Shibayama, Tokyo (JP); Ryuji Ohmura, Tokyo (JP); Yukiyoshi Koda, Tokyo (JP); Kazushi Sugiura, Hyogo (JP)

(73) Assignees: Renesas Technology Corp., Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 09/570,461

(22) Filed: May 12, 2000

(30) Foreign Application Priority Data

Dec. 10, 1999 (JP) .......................................... 11-352047

(51) Int. Cl.⁷ .............................................. G01R 31/28
(52) U.S. Cl. ...................... 714/724; 714/31; 714/719
(58) Field of Search .......................... 714/724, 31, 719; 371/22.1

(56) References Cited

U.S. PATENT DOCUMENTS

| 3,913,072 A | * | 10/1975 | Catt ........................ 340/172.5 |
| 4,721,995 A | * | 1/1988 | Tanizawa ..................... 357/80 |
| 4,729,124 A | * | 3/1988 | Hansel et al. ................. 371/18 |
| 5,159,598 A | * | 10/1992 | Welles, II et al. ......... 371/22.1 |
| 5,341,049 A | * | 8/1994 | Shimizu et al. .......... 307/482.1 |
| 5,406,566 A | * | 4/1995 | Obara ........................ 371/21.2 |
| 5,592,493 A | * | 1/1997 | Crouch et al. ............. 371/22.3 |
| 5,778,006 A | * | 7/1998 | Mukai et al. .............. 371/22.5 |
| 6,480,978 B1 | * | 11/2002 | Roy et al. .................... 714/724 |

FOREIGN PATENT DOCUMENTS

| JP | 63-66798 | 3/1988 |
| JP | 7-174824 | 7/1995 |

* cited by examiner

Primary Examiner—Albert Decady
Assistant Examiner—Dipakkumar Gandhi
(74) Attorney, Agent, or Firm—McDermott, Will & Emery

(57) ABSTRACT

A semiconductor module that comprises a plurality of semiconductor chips mounted on a single substrate and which readily diagnoses all the semiconductor chips. A plurality of semiconductor chips are mounted on a single substrate. The semiconductor module is provided with a mode signal pin for receiving a mode signal for requesting performance of a diagnostic operation, as well as with a result output pin for outputting diagnostic results. Further, each of the semiconductor chips is provided with a diagnostic circuit for diagnosing the status of the corresponding semiconductor chip. The semiconductor module is also provided with a diagnosis controller for controlling the diagnostic circuits such that all the semiconductor chips are diagnosed in parallel or serially after a mode signal for requesting a diagnostic operation has been supplied to the mode signal pin.

8 Claims, 8 Drawing Sheets

Fig.2A Mode Signal
Fig.2B Clock Signal
Fig.2C Status

SEMICONDUCTOR MODULE

BACKGROUND OF THE INVENTION

1. Field of the Invention

The present invention relates to a semiconductor module, and more particularly, to a semiconductor module comprising a plurality of semiconductor chips mounted on a single substrate.

2. Description of the Background Art

FIG. 7 is a conceptual drawing showing a first example configuration of a conventional semiconductor module. A conventional semiconductor module 10 comprises a plurality of semiconductor chips 12 mounted on a single substrate. Each of the semiconductor chips 12 comprises a core circuit 14, such as a memory cell array or a like circuit, and a plurality of input/output pins 16. In FIG. 7, the plurality of input/output pins 16 are simply denoted by a single line.

The input/output pins 16 of the semiconductor chip 12 are connected to input/output pins 20 of the semiconductor module 10 by way of a level conversion element 18. In FIG. 7, the plurality of input/output pins 20 are simply denoted by a single line. The level conversion element 18 is an interface for establishing a match in signal voltage between a circuit disposed outside the semiconductor module 10 and the semiconductor chip 12. An address signal and a data signal are exchanged between the input/output pins 20 and an external circuit.

The semiconductor module 10 is shipped after being subjected to diagnosis as to whether or not the module operates properly. The diagnosis mentioned above is significantly more complex and time consuming than a diagnosis performed on a single semiconductor chip 12. Development of a program for performing such a diagnosis involves an enormous cost and a great deal of time. Moreover, specifying a defective semiconductor chip on the basis of the diagnosis is not necessarily easy.

FIG. 8 is a conceptual drawing showing a second example configuration of a conventional semiconductor module. In FIG. 8, those elements, which are the same as the constituent elements shown in FIG. 7, are assigned the same reference numerals, and repetition of their explanations is omitted. In a semiconductor module 30 shown in FIG. 8, each of a plurality of semiconductor chips 32 has a diagnostic circuit 34. Upon receipt of a predetermined signal from an external circuit, the diagnostic circuit 34 tests the status of the semiconductor chip 32 and outputs the result to the external circuit. In a case where the semiconductor module 30 is a target of the test, the diagnostic circuit 34 can readily detect whether an individual semiconductor chip 14 is non-defective or defective. Accordingly, the configuration shown in FIG. 8 can eliminate difficulty that would otherwise be encountered in specifying a defective chip.

In a case where the semiconductor chips 32 shown in FIG. 8 are target of the test, the plurality of diagnostic circuits 34 provided for the respective semiconductor chips 32 must be controlled individually. In such a case, it becomes necessary that the external circuit individually reads the diagnostic results output from the respective diagnostic circuits 34. Even in a case where the diagnostic circuit 34 is housed in the semiconductor chip 32, diagnosing the semiconductor module 30 requires a complicated control program and a great deal of diagnostic time.

If the semiconductor module 10 or 30 is found to incorporate a defective chip, replacement of the chip is not easy. For this reason, if the semiconductor module 10 or 30 incorporates even a single defective chip, the module 10 or 30 as a whole is diagnosed as being defective. As mentioned above, since comprehensive diagnosis of a conventional semiconductor module is not easy and replacement of a defective chip is not easy, there arises a problem of an increase in manufacturing cost and the number of manufacturing steps.

SUMMARY OF THE INVENTION

The present invention has been conceived to solve the above-described problem and is aimed at providing a semiconductor module in which the entirety of a plurality of semiconductor chips can be diagnosed readily.

The present invention is also aimed at providing a semiconductor module in which a defective chip can be readily replaced.

The above objects of the present invention are achieved by a semiconductor module including a plurality of semiconductor chips to be mounted on a single substrate. The semiconductor module includes a mode signal pin for receiving a mode signal for requesting performance of a diagnostic operation the semiconductor module also includes a result output pin for outputting a result of diagnosis. The semiconductor module further includes diagnostic circuits for diagnosing the statuses of the corresponding semiconductor chips. The diagnostic circuits are controlled by a diagnosis controller such that all the semiconductor chips are diagnosed in parallel or serially after a mode signal for requesting a diagnostic operation has been supplied to the mode signal pin.

Other objects and further features of the present invention will be apparent from the following detailed description when read in conjunction with the accompanying drawings.

DESCRIPTION OF THE PREFERRED EMBODIMENTS

Figure 1:
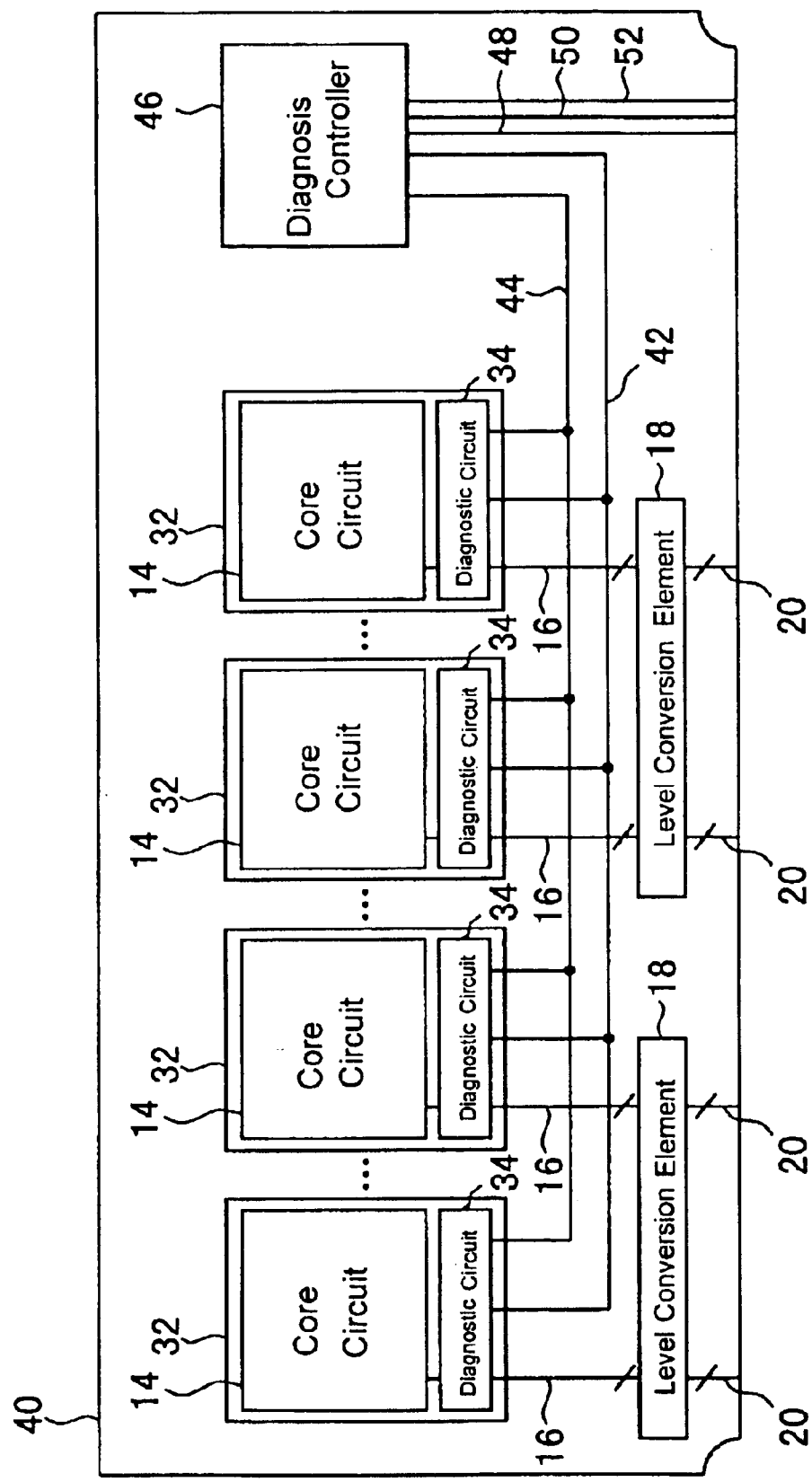
FIG. 1 is a block diagram for describing the configuration of a semiconductor module according to a first embodiment of the present invention.

In the following, principles and embodiments of the present invention will be described with reference to the accompanying drawings. Throughout the drawings, like reference numerals designate like elements, and repetition of their explanations are omitted for brevity.

FIRST EMBODIMENT

FIG. 1 is a conceptual rendering showing the configuration of a semiconductor module 40 according to a first embodiment of the present invention. A semiconductor module 40 of the present embodiment comprises a plurality of semiconductor chips 32 mounted on a single substrate. Each of the semiconductor chips 32 comprises a core circuit 14, such as a memory cell array or a like circuit, and a plurality of input/output pins 16. In FIG. 1, the plurality of input/output pins 16 are simply denoted by a single line.

The respective input/output pins 16 of the semiconductor chip 32 are connected to a level conversion element 18 by way of an interconnection provided on the substrate. Further, the level conversion element 18 is connected to input/output pins 20 corresponding to the respective input/output pins 16. In FIG. 1, a plurality of input/output pins 20 are simply denoted by a single line. The level conversion element 18 is an interface for establishing a match in signal voltage between a circuit disposed outside the semiconductor module 40 and the semiconductor chip 32. An address signal and a data signal are exchanged between the input/output pins 20 and the external circuit.

The semiconductor chip 32 incorporates a diagnostic circuit 34. The diagnostic circuit 34 is connected to a diagnosis controller 46 by way of a control signal line 42 and a result signal line 44. Upon receipt of a predetermined signal by way of the control signal line 42, the diagnostic circuit 34 diagnoses the status of the semiconductor chip 32 and outputs the result of the diagnosis to the result signal line 44. The diagnosis controller 46 incorporates a CPU and memory and is connected to a mode signal pin 48, a clock signal pin 50, and a result output pin 52, which are provided in the semiconductor module 40.

Figure 2:
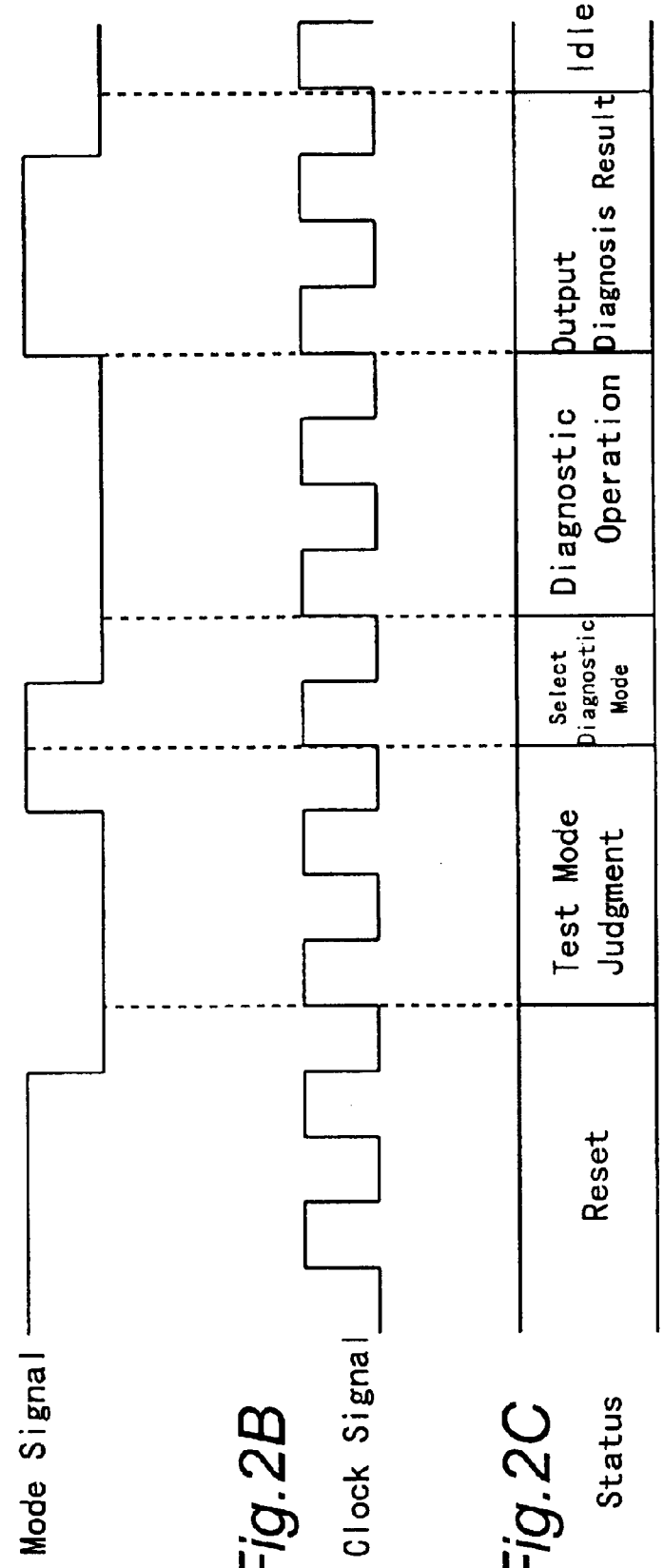
FIGS. 2A to 2C are timing charts for explaining the performance of the semiconductor module show in FIG. 1.

The operation of the semiconductor module 40 will next be described by reference to FIG. 2. FIG. 2A shows a signal waveform supplied to the mode signal pin 48 when a request for performance of a diagnostic operation is sent to the semiconductor module 40. FIG. 2B shows the waveform of a clock signal supplied to a clock signal pin 50. FIG. 2C shows the status of the semiconductor module 40 before and after performance of diagnostic operation.

Upon receipt of a leading edge of a clock signal, the diagnosis controller 46 of the semiconductor module 40 reads a mode signal. In a case where the mode signal is maintained at a high level, the diagnosis controller 46 holds the semiconductor module 40 in a reset state. In contrast, in a case where the mode signal is continuously maintained at a low judgment level over two clock intervals, the diagnosis controller 46 enters a test mode.

When entering a test mode, the diagnosis controller 46 selects a diagnostic mode according to the value of a mode signal arising during the period of the next clock interval. In the present embodiment, by way of the processing operation mentioned above, there is selected either a parallel processing mode in which the plurality of semiconductor chips 32 are diagnosed in parallel or a serial processing mode in which the plurality of semiconductor chips 32 are diagnosed serially.

When the diagnostic mode is selected, the diagnosis controller 46 supplies, to the plurality of diagnostic circuits 34, an instruction signal for initiating diagnosis. Subsequently, the plurality of semiconductor chips 32 are diagnosed over a predetermined clock interval. The individual diagnostic circuit 34 supplies the result of diagnosis of the semiconductor chip 32 to the diagnosis controller 46 in accordance with a rule that has been determined for each diagnostic mode beforehand. The diagnosis controller 46 stores the diagnostic result in memory, linking the result and the diagnostic circuit 34 (i.e., the semiconductor chip 32) that is the sender of the former.

At a point in time when diagnosis of all the semiconductor chips 32 has been completed, the mode signal is switched from a low level to a high level. When detecting the switching of the level of the mode signal in conjunction with the leading edge of the clock signal, the diagnosis controller 46 outputs to the output pin 52 the diagnostic result stored in the memory. Accordingly, the circuit provided outside the semiconductor module 40 can ascertain the status of each of the semiconductor chips 32 by monitoring solely the diagnostic result output to the result output pin 52.

After the diagnostic results of all the semiconductor chips 32 have been output to the result output pin 52, the mode signal is switched from a high level to a low level. Upon detection of the switching of the level of the mode signal, the diagnosis controller 46 terminates the test mode.

As mentioned above, the semiconductor module 40 of the present embodiment can diagnose the plurality of semiconductor chips 32 by controlling only a single diagnosis controller 46. For this reason, the semiconductor module 40 of the present embodiment is able to readily diagnose the entirety of the semiconductor module 40.

Further, the semiconductor module 40 of the present embodiment can complete diagnosis of each semiconductor chip 32 individually. Therefore, the semiconductor module 40 of the present embodiment is able to accurately diagnose the status of all the semiconductor chips regardless of the status of each semiconductor chip.

In the present embodiment, the diagnosis of all the semiconductor chips 32 housed in the individual semiconductor module 40 is completed within the module 40. Thus, according to the configuration of the present embodiment, even in a case where a plurality of semiconductor modules 40 are mounted on a single substrate, it is possible to accurately diagnose the status of each of the modules 40 regardless of the status of another module 40.

In the semiconductor module 40 of the present embodiment, the diagnostic results pertaining to the semiconductor chips 32 are stored in the memory of the diagnosis controller 46 for each chip, then outputted in the form of a series of signals. By monitoring the thus-output signal, the external circuit can diagnose the status of the semiconductor module 40 and can readily specify a defective semiconductor chip 32 within a short time.

SECOND EMBODIMENT

Figure 3:
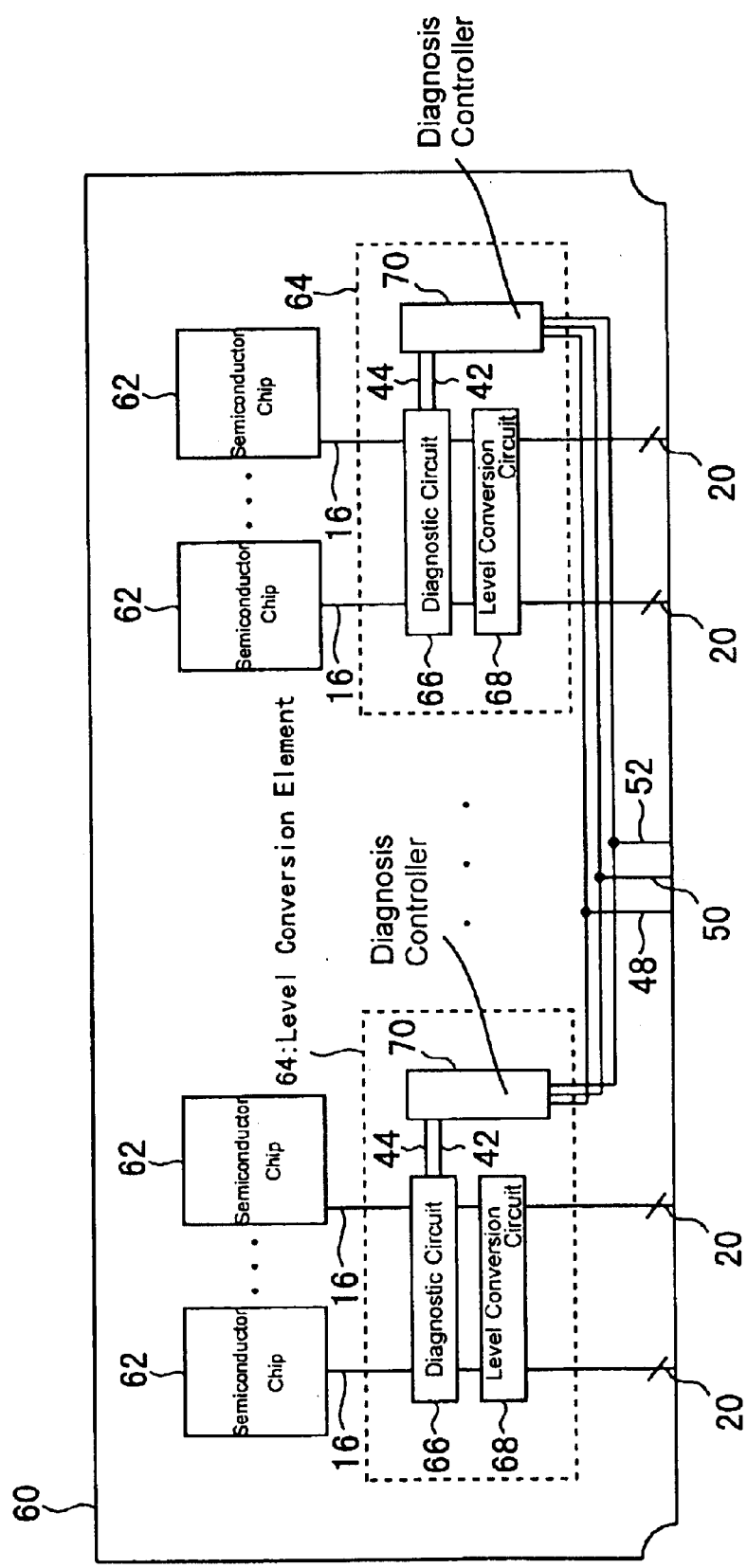
FIG. 3 is a block diagram for describing the configuration of a semiconductor module according to a second embodiment of the present invention.

FIG. 3 is a conceptual drawing showing the configuration of a semiconductor module 60 according to a second embodiment of the present invention. The semiconductor module 60 comprises a plurality of semiconductor chips 62 mounted on a single substrate. In contrast with the semiconductor chip 32 of the first embodiment, the semiconductor chip 62 does not have any built-in diagnostic circuit. The plurality of input/output pins 16 (simply denoted by a single line in FIG. 3) led from the semiconductor chip 62 are connected to a level conversion element The level conversion element 64 has packaged therein a diagnostic circuit 66, a level conversion circuit 68, and a diagnosis controller 70. One diagnostic circuit 66 is provided for a predetermined number of semiconductor chips 62 and can diagnose the status of each of the semiconductor chips 62 sequentially. The level conversion circuit 68 corresponds to the level conversion element 18 of the first embodiment, and the plurality of input/output pins 20 (simply denoted by a single line in FIG. 3) corresponding to the respective input/output pins 16 are connected to the level conversion circuits 68. Further, the diagnosis controller 70 corresponds to the diagnosis controller 46 of the first embodiment and is connected to the diagnostic circuit 66 by way of the control line 42 and the result signal line 44. The diagnosis controllers 70 are electrically connected to the mode signal pin 48, the clock signal pin 50, and the result output pin 52, which are provided in the semiconductor module 60.

In the semiconductor module 60 of the present embodiment, the plurality of semiconductor chips 62 corresponding to the single level conversion element 64 are taken as a unit, and a diagnostic operation which is the same as that performed in the first embodiment can be performed on a per-unit basis. The semiconductor module 60 comprises a plurality of units mentioned above on a single substrate, and diagnoses the plurality of units with the parallel processing technique or the serial processing technique before sequentially outputs the results to the result output pin 52. Accordingly, the semiconductor module 60 of the present embodiment can yield the same working-effect as that yielded by the semiconductor module 60 of the first embodiment.

Mounting the semiconductor chips 62 and the level conversion elements 64 on a single substrate can embody the semiconductor module 60 of the present embodiment. The configuration of the present embodiment can be embodied through use of the same number of components as used for constituting a semiconductor module of a common configuration (i.e., a semiconductor module not having a diagnostic circuit or a diagnosis controller). The semiconductor module 60 of the present embodiment can be readily implemented by modification of the circuitry of a common semiconductor module. Further, the semiconductor module 60 of the present embodiment does not require incorporation of a diagnostic circuit in the semiconductor chip 62. Accordingly, the semiconductor module 60 of the present invention can be readily embodied through use of a common semiconductor chip not having a built-in diagnostic circuit.

In the second embodiment, the diagnostic circuit 66 sequentially diagnoses the plurality of semiconductor chips 62; however, the present invention is not limited to such an embodiment. More specifically, a plurality of circuits corresponding to the respective semiconductor chips 62 may be provided in the diagnostic circuit 66, and all the semiconductor chips 62 may be diagnosed through parallel processing, as in the case of the first embodiment.

THIRD EMBODIMENT

Figure 4:
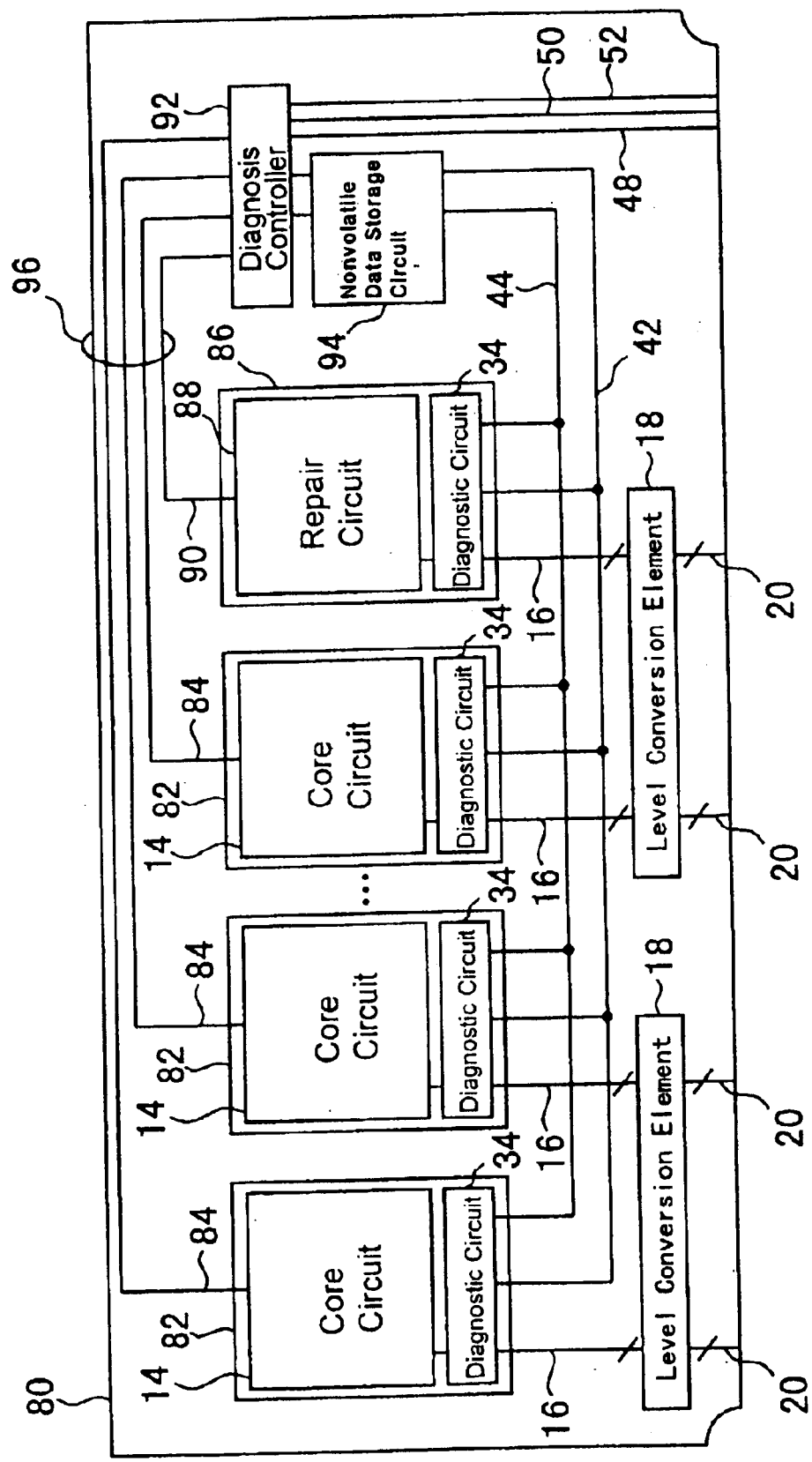
FIG. 4 is a block diagram for describing the configuration of a semiconductor module according to a third embodiment of the present invention.

FIG. 4 is a conceptual drawing showing the configuration of a semiconductor module 80 according to a third embodiment of the present invention. The semiconductor module 80 of the third embodiment comprises a plurality of semiconductor chips 82 to be mounted on a single substrate. Each of the semiconductor chips 82 comprises a chip enable terminal 84 and selectively fulfills an enabled state or a disabled state, in accordance with a signal supplied to the chip enable terminal 84.

The semiconductor module 80 further comprises a repair semiconductor chip 86. The repair semiconductor chip 86 comprises a diagnostic circuit 34 and a repair circuit 88, which acts in the same way as does the core circuit 14. As in the case of the previously described semiconductor chip 82, the repair semiconductor chip 86 selectively fulfills either an active state or an inactive state in accordance with a signal supplied to a chip enable terminal 90.

The semiconductor module 80 further comprises a diagnosis controller 92 and a nonvolatile data storage circuit 94. The diagnosis controller 92 is electrically connected to the mode signal pin 48, the clock signal 50, and the result output pin 52 and causes the individual diagnostic circuits 34 to perform a predetermined diagnostic operation in the same fashion as does the diagnosis controller 46 of the first embodiment. The nonvolatile data storage circuit 94 is constituted of programmable nonvolatile memory. In the present embodiment, diagnostic results to be transmitted by way of the result signal line 44; i.e., diagnostic results relating to the semiconductor chip 82 and the repair semiconductor chip 86, are stored in the nonvolatile data storage circuit 94 and are output to the result output pin 52 at predetermined timing.

In the semiconductor module 80 of the present embodiment, the chip enable terminal 84 of the individual semiconductor chip 82 and the diagnosis controller 92 are interconnected by means of an enable signal line 96. Similarly, the chip enable terminal 90 of the repair semiconductor chip 86 and the diagnosis controller 92 are interconnected by means of the enable signal line 96. If, on the basis of the diagnostic result stored in the nonvolatile data storage circuit 94, any one of the semiconductor chips 82 is determined to be defective, the diagnosis controller 92 supplies a disable signal to the thus-determined semiconductor chip 82 and an enable signal to the repair semiconductor chip 86 in place of the defective semiconductor chip 82.

Every time the semiconductor module 80 is started up, the diagnosis controller 92 performs the above processing operation, to thereby activate the normal repair semiconductor chip 86 in lieu of the defective semiconductor chip 82. The semiconductor module 80 of the present embodiment enables replacement of the defective semiconductor chip 82 with the normal repair semiconductor chip 86. Thus, the semiconductor module 80 of the present embodiment enables correction of a failure in the semiconductor module 80, thereby increasing manufacturing yield and reducing production costs.

Although in the third embodiment the diagnostic circuit 34 is incorporated in the semiconductor chip 82, the present invention is not limited to this embodiment; the diagnostic circuit 34 may be incorporated into the level conversion element 18.

FOURTH EMBODIMENT

Figure 5:
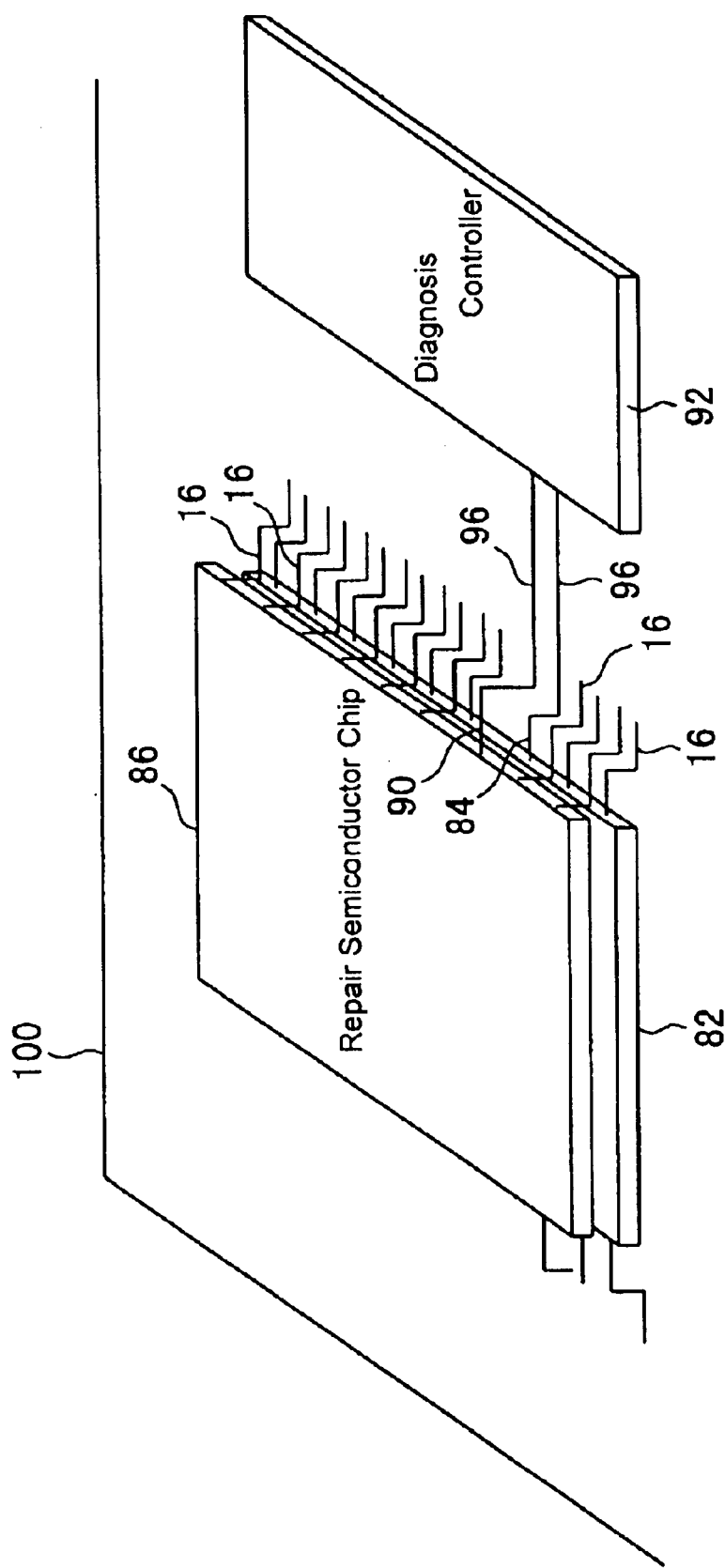
FIG. 5 is a perspective view showing the principal section of a semiconductor module according to a fourth embodiment of the present invention.

FIG. 5 is a perspective view showing the principal section of a semiconductor module 100 according to a fourth embodiment of the present invention. The semiconductor module 100 of the present embodiment can be represented by a block diagram identical with that of the semiconductor module 80 of the third embodiment; i.e., a block diagram such as that shown in FIG. 4. As shown in FIG. 5, the semiconductor module 100 is characterized in that the repair semiconductor chip 86 is stacked on a specific semiconductor chip 82.

In the configuration of the semiconductor module 100, the chip enable terminal 84 of the semiconductor chip 82 is connected to the diagnosis controller 92 by way of an enable signal line 96, and the chip enable terminal 90 of the repair semiconductor chip 86 is connected to the diagnosis controller 92 by way of another signal line 96. Further, the input/output pins 16 of the semiconductor chip 82 are connected to interconnections provided on the substrate, and the input/output pins 16 of the repair semiconductor chip 86 are connected to another interconnections provided on the substrate. The configuration of the semiconductor module 100 shown in FIG. 5 can be embodied without newly requiring a space for the repair semiconductor chip 86. Thus, the present embodiment enables recovery of a defective semiconductor chip while realizing a compact semiconductor module 100.

FIFTH EMBODIMENT

Figure 6:
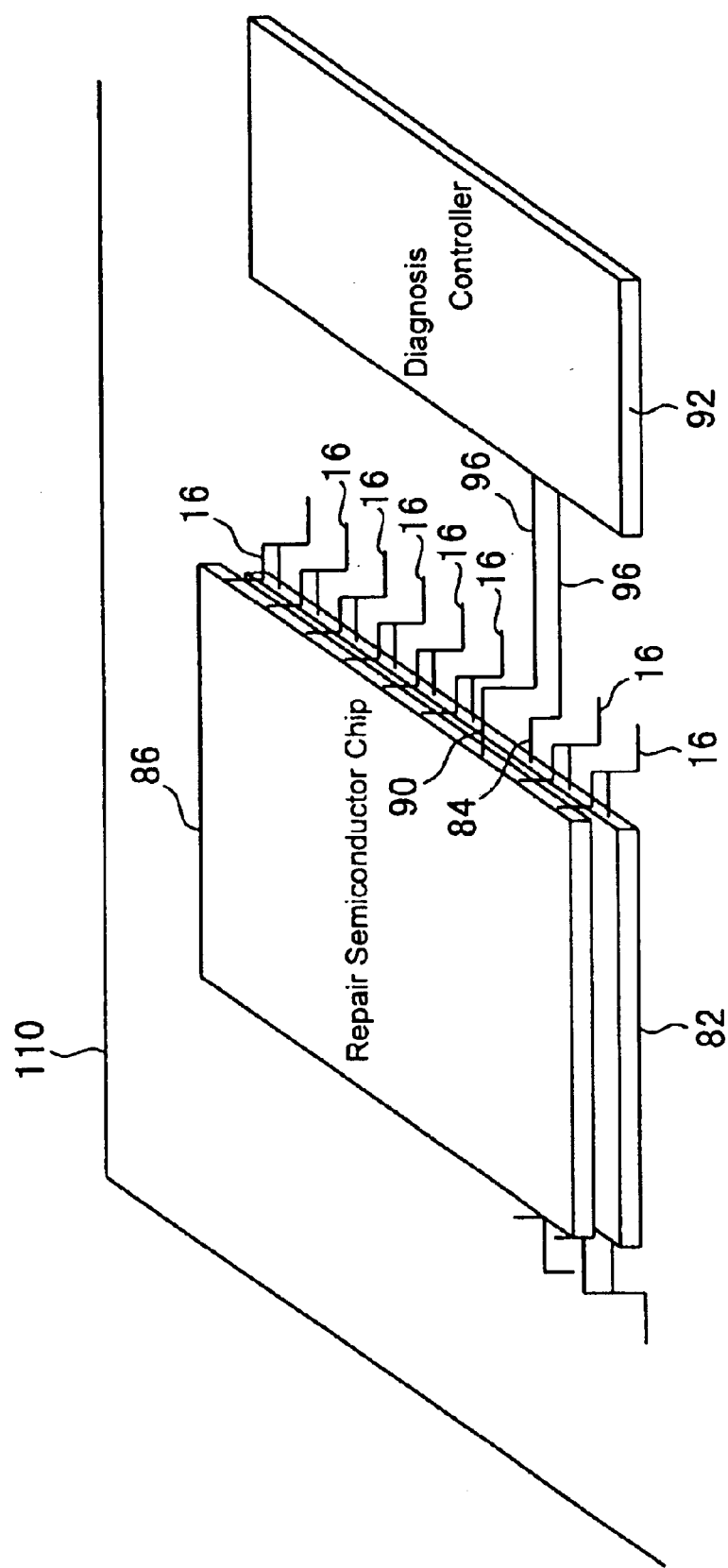
FIG. 6 is a perspective view showing the principal section of a semiconductor module according to a fifth embodiment of the present invention.
Figure 7:
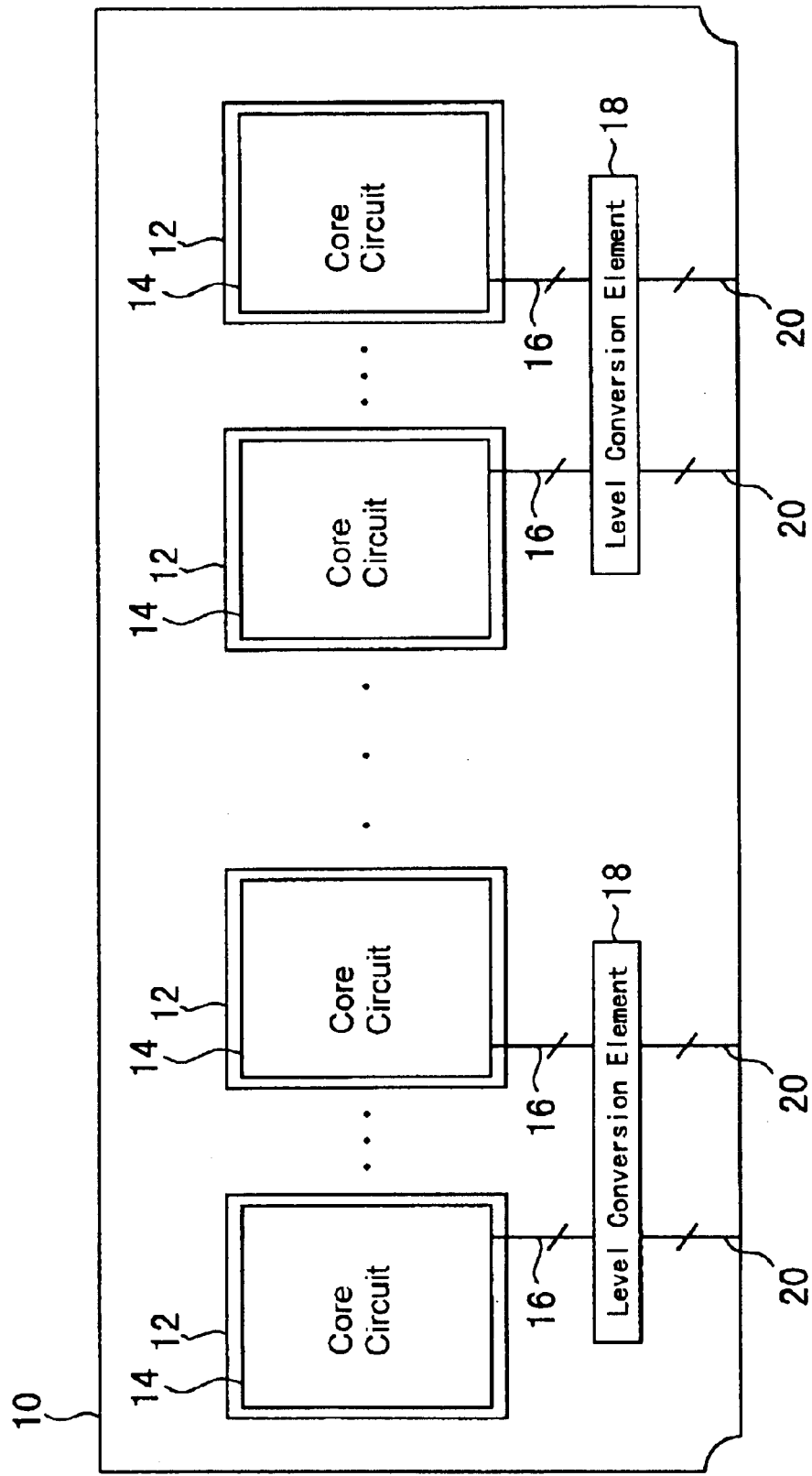
FIG. 7 is a block diagram for describing the configuration of a first former semiconductor module.
Figure 8:
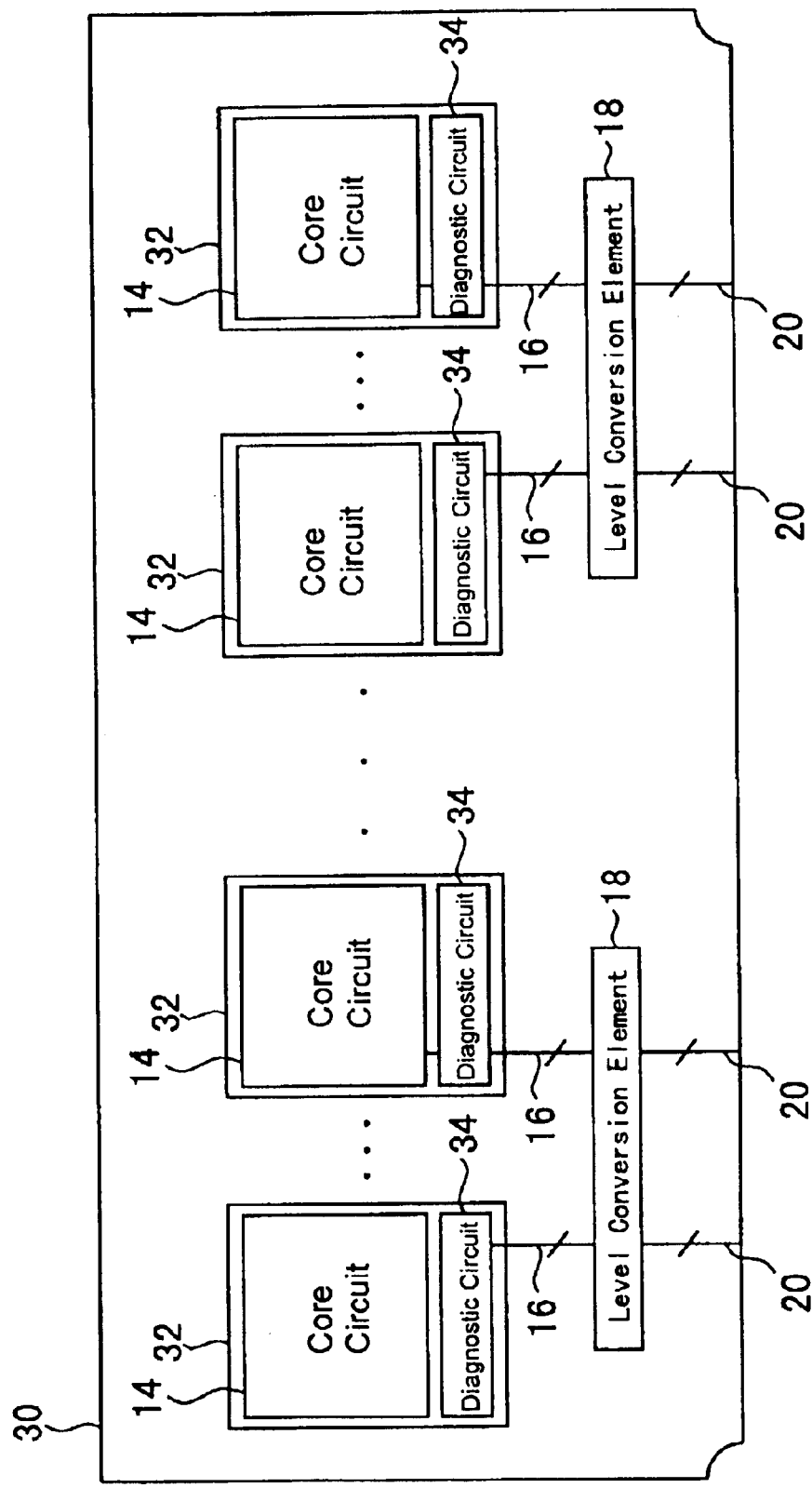
FIG. 8 is a block diagram for describing the configuration of a second former semiconductor module.

FIG. 6 is a perspective view showing the principal section of a semiconductor module 110 according to a fifth embodiment of the present invention. The semiconductor module 110 of the present embodiment is identical in configuration with the semiconductor module 80 of the third embodiment, except that repair semiconductor chips 86 are provided so as to correspond to the plurality of semiconductor chips 82, respectively, and that the repair semiconductor chips 86 are stacked on the corresponding semiconductor chips 82.

The chip enable terminal 84 of the semiconductor chip 82 is connected to the diagnosis controller 92 by way of an enable signal line 96, and the chip enable terminal 90 of the repair semiconductor chip 86 is connected to the diagnosis controller 92 by way of another enable signal line 96. Further, every input/output pin 16 of the semiconductor chip 82 and the corresponding input/output pin 16 of the repair semiconductor chip 86 are connected to a single interconnection provided on the substrate.

In the semiconductor module 110 of the present embodiment, the diagnostic circuit 34 provided in the semiconductor chip 82 and that provided in the repair semiconductor chip 86 can perform diagnosis independently. In a case where any one of the semiconductor chips 82 is found to be defective, the repair semiconductor chip 86 corresponding to the defective semiconductor chip 82 becomes active in place of the later, thus enabling recovery of a defective semiconductor chip.

In the module 110, the repair semiconductor chips 86 are provided so as to correspond to the respective semiconductor chips 82. In the event of a plurality of semiconductor chips 82 being found defective, each of the defective semiconductor chips 82 can be replaced with its corresponding normal repair semiconductor chips 86. Therefore, the semiconductor module 110 of the present embodiment can be manufactured at yields better than those achieved by the semiconductor modules 80 and 100 of the third and fourth embodiments.

In the semiconductor module 110, every input/output pin 16 of the semiconductor chip 82 and corresponding input/output pin 16 of the repair semiconductor chip 86 are connected to a single interconnection provided on the substrate. For this reason, a pitch between interconnections to be formed on the substrate can be made wider than that required in the fourth embodiment. Accordingly, the semiconductor module 110 of the present embodiment can be manufactured more readily than can the semiconductor module 100 of the fourth embodiment.

Although in the first through fifth embodiments a plurality of semiconductor chips to be packaged in a semiconductor module is limited to chips of the same type, the present invention is not limited to these embodiments. A plurality of semiconductor chips to be packaged into a semiconductor module may be of different types. More specifically, the present invention can also be applied to a CPU board comprising a single substrate on which semiconductor chips of different types are mounted.

Although in the fourth and fifth embodiments the repair semiconductor chip 86 is stacked on the corresponding semiconductor chip 82, the present invention is not limited to these embodiments; the semiconductor chip 82 may be stacked on the repair semiconductor chip 86.

The major benefits of the present invention described above are summarized as follows:

According to the first aspect of the present invention, a diagnostic circuit and a diagnosis controller are packaged in a semiconductor module. By means of such a configuration, the entirety of the semiconductor module can be diagnosed by supplying, to a mode signal pin, only a signal for requesting diagnosis of the semiconductor module.

According to the second aspect of the present invention, the diagnostic circuit is incorporated in the level conversion element. Hence, the present invention enables realization of a semiconductor module that can be readily diagnosed, without involvement of an increase in the number of elements to be mounted on a substrate and through use of common semiconductor chips that do not incorporate diagnostic circuits.

According to the third aspect of the present invention, a diagnosis controller is incorporated in the level conversion element. Hence, the present invention enables realization of a semiconductor module that can be readily diagnosed, without involving a necessity for separately providing a diagnosis controller on the substrate.

According to the fourth aspect of the present invention, diagnostic results pertaining to individual semiconductor chips are stored in memory and later output in the form of a single signal to a result output pin at predetermined timing. As a result, an external circuit can determine the status of all semiconductor chips provided in the semiconductor module in a short time by monitoring only the signal.

According to the fifth aspect of the present invention, in the event of any one of the plurality of semiconductor chips being found to be defective, the defective chip can be replaced with a repair semiconductor chip. Therefore, the present invention enables realization of a semiconductor module that can recover from failure and ensure high manufacturing yield.

According to the sixth aspect of the present invention, since the memory for storing the diagnosis results pertaining to semiconductor chips is nonvolatile, the diagnosis controller can unfailingly replace a defective semiconductor chip with a normal repair semiconductor chip every time the semiconductor module is started up.

According to the seventh aspect of the present invention, since the repair semiconductor chip and the corresponding semiconductor chip are stacked in a multi-layer configuration, there can be eliminated a necessity for ensuring a space dedicated solely to a repair semiconductor chip. Accordingly, the present invention can embody a semiconductor module capable of recovering from failure without involvement of an increase in the size of the module.

According to the eighth aspect of the present invention, a semiconductor module that includes different types of semiconductor chips, as does a CPU board can be easily diagnosed.

Further, the present invention is not limited to these embodiments, but variations and modifications may be made without departing from the scope of the present invention.

The entire disclosure of Japanese Patent Application No. Hei 11-352047 filed on Dec. 10, 1999 including specification, claims, drawings and summary are incorporated herein by reference in its entirety.

What is claimed is:

1. A semiconductor module including a plurality of semiconductor chips to be mounted on a common substrate, comprising:
   a mode signal pin for receiving a mode signal for requesting performance of a diagnostic operation;
   a result output pin for outputting a result of diagnosis;
   a clock signal pin supplied with a clock signal;
   diagnostic circuits for diagnosing the statuses of the corresponding semiconductor chips; and
   a diagnosis controller for controlling the diagnostic circuits such that all the semiconductor chips are diagnosed in parallel or serially after a mode signal for requesting a diagnostic operation has been supplied to the mode signal pin upon receipt of a leading edge of the clock signal.

2. The semiconductor module according to claim 1, further comprising:
   level conversion elements which are to be mounted on the substrate for enabling exchange of signals between the semiconductor chips and an external device and which respectively incorporate the diagnostic circuits.

3. The semiconductor module according to claim 2, wherein the diagnosis controller is incorporated in each of the level conversion elements.

4. The semiconductor module according to claim 1, further comprising:
   a memory for storing the result of diagnosis of the respective semiconductor chip performed by the diagnostic circuits; and
   the diagnosis controller controlling the memory such that the diagnostic results stored in the memory are output to the result output pin after diagnosis of all semiconductor chips has been completed.

5. The semiconductor module according to claim 1, further comprising:
   a repair semiconductor chip having the same function as that of the semiconductor chip;
   each of the semiconductor chips and the repair semiconductor chips having a chip enable terminal; and
   the diagnosis controller supplying a chip disable signal for instructing a semiconductor chip to become inactive in the event that the semiconductor chip is found to be defective, as well as supplying a chip enable signal for instructing the corresponding repair semiconductor chip to become active in place of the defective semiconductor chip.

6. The semiconductor module according to claim 5, further comprising a nonvolatile memory for storing diagnostic results output from the diagnostic circuits; and
   the diagnosis controller outputting a chip enable signal or a chip disable signal on the basis of the diagnostic results stored in the nonvolatile memory.

7. The semiconductor module according to claim 5, wherein the repair semiconductor chip and the corresponding semiconductor chip are stacked on atop the other into a multilayer configuration.

8. The semiconductor module according to claim 1, wherein the plurality of semiconductor chips include semiconductor chips of different types.

* * * * *